United States Patent [19]

Ohkubo

[11] Patent Number: 5,521,860
[45] Date of Patent: May 28, 1996

[54] CMOS STATIC MEMORY

[75] Inventor: Hiroaki Ohkubo, Tokyo, Japan

[73] Assignee: NEC Corporation, France

[21] Appl. No.: 358,017

[22] Filed: Dec. 16, 1994

[30] Foreign Application Priority Data

Dec. 20, 1993 [JP] Japan .................................. 5-319494

[51] Int. Cl.⁶ .................................................. H01L 27/11
[52] U.S. Cl. ........................... 365/154; 257/903; 257/369; 257/351
[58] Field of Search ............................ 365/154; 257/903, 257/69, 369, 385, 351

[56]  References Cited

U.S. PATENT DOCUMENTS

| 5,012,443 | 4/1991 | Ema | 365/154 |
| 5,239,196 | 8/1993 | Ikeda et al. | 365/154 |
| 5,396,105 | 3/1995 | Nakayama | 365/154 |

FOREIGN PATENT DOCUMENTS 3-114256  5/1991  Japan ........................... H01L 27/11

*Primary Examiner*—David C. Nelms
*Assistant Examiner*—Vu A. Le
*Attorney, Agent, or Firm*—Hayes, Soloway, Hennessey, Grossman & Hage

[57]  ABSTRACT

Two intracell wiring serving as the gate electrodes of driver transistors and load transistors and arranged substantially parallel to each other between two word lines substantially parallel to each other so as to be perpendicular to the word lines are arranged as the first layer. Ground wiring and a power supply wiring are arranged as the second layer on the first layer through an insulating film. Each intracell wiring serves as the gate electrodes of one driver transistor and one load transistor and is connected to the drain regions of the other driver transistor and the other load transistor. The ground wiring are connected to the source regions of the driver transistors, and the power supply wiring is connected to the source regions of the load transistors.

3 Claims, 9 Drawing Sheets

FIG.6
FIG.7
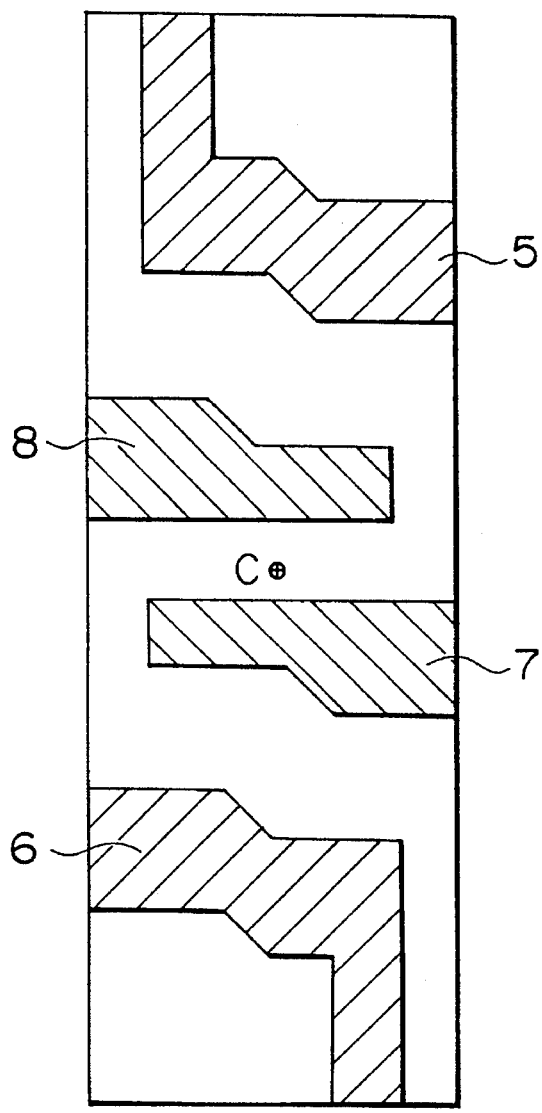
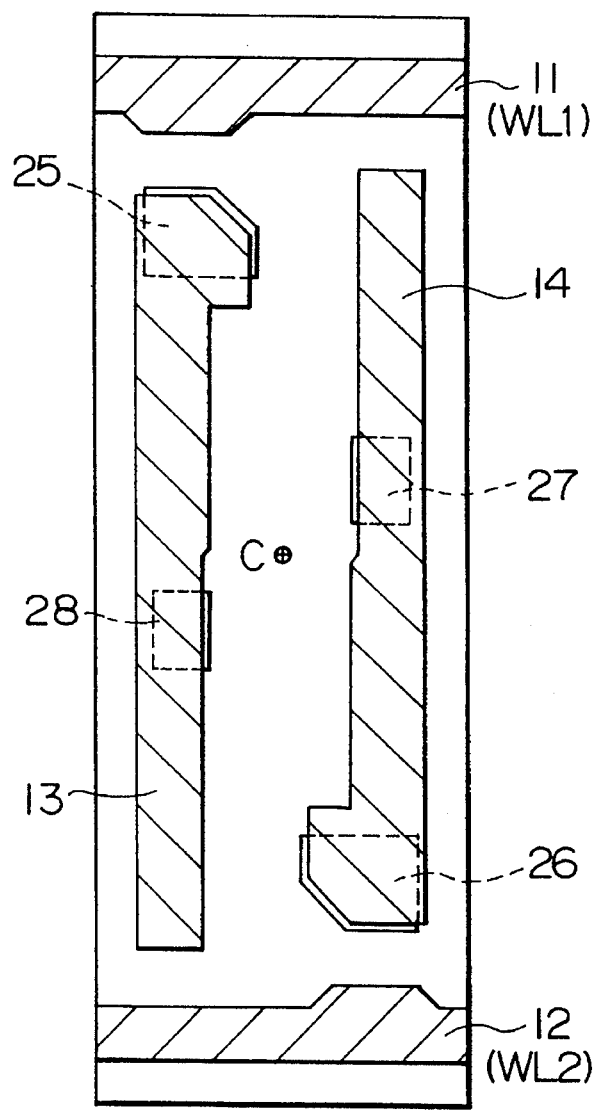

CMOS STATIC MEMORY

BACKGROUND OF THE INVENTION

1. Field of the Invention

The present invention relates to a CMOS static memory and, more particularly, to a CMOS static memory in which the constituent elements of a memory cell are arranged point symmetrical.

2. Description of the Prior Art

A full CMOS static random access memory (to be abbreviated as an SRAM hereinafter) disclosed in Japanese Unexamined Patent Publication No. 3-114256 is known as a conventional CMOS static memory in which two driver transistors, two load transistors, and two switching transistors in a memory cell are respectively arranged point symmetrical. The arrangement will be described below with reference to FIGS. 1 to 3.

FIG. 1 is a circuit diagram of a full CMOS SRAM cell. An SRAM cell is located at an intersection between complementary data lines DL1 and DL2 and a set of word lines WL1 and WL2 and connected to the data and word lines by switching transistors Qt1 and Qt2. The source regions of driver transistors Qd1 and Qd2 are connected to a ground wiring Vss, and the source regions of load transistors Ql1 and Ql2 are connected to a power supply wiring Vcc. The switching transistors Qt1 and Qt2 and the driver transistors Qd1 and Qd2 are n-channel MOSFETs while the load transistors Ql1 and Ql2 are p-channel MOSFETs.

FIG. 2 is a plan view showing the layout of the unit cell of the full CMOS SRAM. FIG. 3 is a plan view schematically showing the main part of the unit cell in FIG. 2, and FIG. 4 is a perspective view showing a section taken along a line A–B in FIG. 2.

The switching transistor Qt1 is constituted by source and drain regions 117 and 118 and a gate electrode 111. The switching transistor Qt2 is constituted by source and drain regions 127 and 128 and a gate electrode 116. The driver transistor Qd1 is constituted by source and drain regions 120 and 119 and a gate electrode 112. The driver transistor Qd2 is constituted by source and drain regions 125 and 126 and a gate electrode 115. The load transistor Ql1 is constituted by source and drain regions 123 and 124 and a gate electrode 114. The load transistor Ql2 is constituted by source and drain regions 122 and 121 and a gate electrode 113. Source connecting electrodes 139 and 140 of the driver transistor Qd1 and Qd2 serve as ground wiring layers. A source connecting electrode 147 of the load transistors Ql1 and Ql2 serves as a power supply wiring. A connection wiring 137 is connected to the gate electrode of the driver transistor Ql1, the drain region of the load transistor Ql2, the gate electrode of the load transistor Ql1, and the drain region of the driver transistor Qd2 through contact holes 130, 131, 133, and 136, respectively. A connection wiring 138 is connected to the drain region of the driver transistor Qd1, the gate electrode of the load transistor Ql2, the drain region of the load transistor Ql1, and the gate electrode of the driver transistor Qd2 through contact holes 129, 132, 134, and 135, respectively.

This cell arrangement has the following features.

(1) The source and drain regions 119, 120, 126, and 125 and the gate electrodes 112 and 115 of the two driver transistors Qd1 and Qd2, the source and drain regions 123, 124, 122, and 121 and the gate electrodes 114 and 113 of the two load transistors Ql1 and Ql2, the source and drain regions 117, 118, 128, and 127 and the gate electrodes 111 and 116 of the two switching transistors Qt1 and Qt2, and the connection wiring 137 and 138 for connecting the gate electrodes and the source and drain regions are arranged symmetrical about a central point C of the cell.

(2) All the gate electrodes 111 to 116 of the MOSFETs are arranged in parallel.

(3) The source and drain connecting electrodes 139 to 147 of the MOSFETs are formed by self-alignment using a field insulating film as a mask.

Because of feature (1), the structures of portions where a memory node capacitance is formed in the cell are arranged symmetrical, so that the storage capacitances are equalized with each other to stabilize the storage state. Because of features (2) and (3), the sizes of the source and drain regions in a direction perpendicular to the gate electrodes are reduced to arrange the MOSFETs close to each other, thereby improving the degree of integration.

In this conventional CMOS static memory, the ground and power supply wiring are formed by the source region extraction electrodes between the gate electrodes which are arranged in parallel, so that the wiring width is limited by an interval between the gate electrodes. For this reason, the wiring resistance increases with an advance in micropatterning. This causes increase in ground potential and decrease in power supply potential, which are supplied to the cell, thereby degrading the stability of the cell. Although a conductive layer serving as a ground wiring and a power supply wiring can be formed with a sufficient wiring width on the connection wiring, this increases the number of steps in formation of the wiring and the contact holes. Additionally, since the gate electrodes and the drain regions are connected by the connection wiring, nine contact holes including contact holes (½×2) for the data lines need to be formed in the unit cell. Therefore, micropatterning of the cell is undesirably limited due to a margin around a contact hole, which is required to ensure a contact hole yield, i.e., a cell yield. Particularly, in connection of the connection wiring and the gate electrodes, the contact holes are formed in the entire source regions due to misalignment of contact holes on the gate electrodes, thereby causing a short circuit between the contact holes and the gate electrodes. For this reason, a sufficient margin is required between the contact hole and the gate electrode.

SUMMARY OF THE INVENTION

It is an object of the present invention to provide a CMOS static memory having constituent elements arranged point symmetrical, in which the storage capacitances of two nodes or capabilities of to-be-connected transistors are equalized to stabilize the operation of a cell, and at the same time, extra wiring for internal wiring are eliminated, and a sufficient wiring width of a ground or power supply wiring is obtained to decrease a wiring resistance, thereby ensuring stability of the cell.

According to the present invention, there is provided a CMOS static memory in which first and second driver transistors, first and second load transistors, and first and second switching transistors are respectively arranged point symmetrical in a memory cell, comprising first and second word lines serving as gate electrodes of the first and second switching transistors and arranged substantially parallel to each other, first and second intracell wiring arranged substantially parallel to each other between the two word lines so as to be perpendicular to the word lines, and ground wiring and a power supply wiring arranged on the word lines and the first and second intracell wiring through an insulating film, wherein the first intracell wiring serves as gate electrodes of the first driver transistor and the first load transistor and is connected to drain regions of the second driver transistor and the second load transistor, the second intracell wiring serves as gate electrodes of the second driver transistor and the second load transistor and is connected to drain regions of the first driver transistor and the first load transistor, the ground wiring layers are respectively connected to source regions of the first and second driver transistors, and the power supply wiring is connected to source regions of the first and second load transistors.

BRIEF DESCRIPTION OF THE DRAWINGS

FIG. 6 is a plan view showing a memory cell layer of the CMOS static memory shown in FIG. 5;

FIG. 7 is a plan view showing a memory cell layer of the CMOS static memory shown in FIG. 5;

DETAILED DESCRIPTION OF THE PREFERRED EMBODIMENTS

An embodiment of the present invention will be described below with reference to the accompanying drawings.

Figure 1:
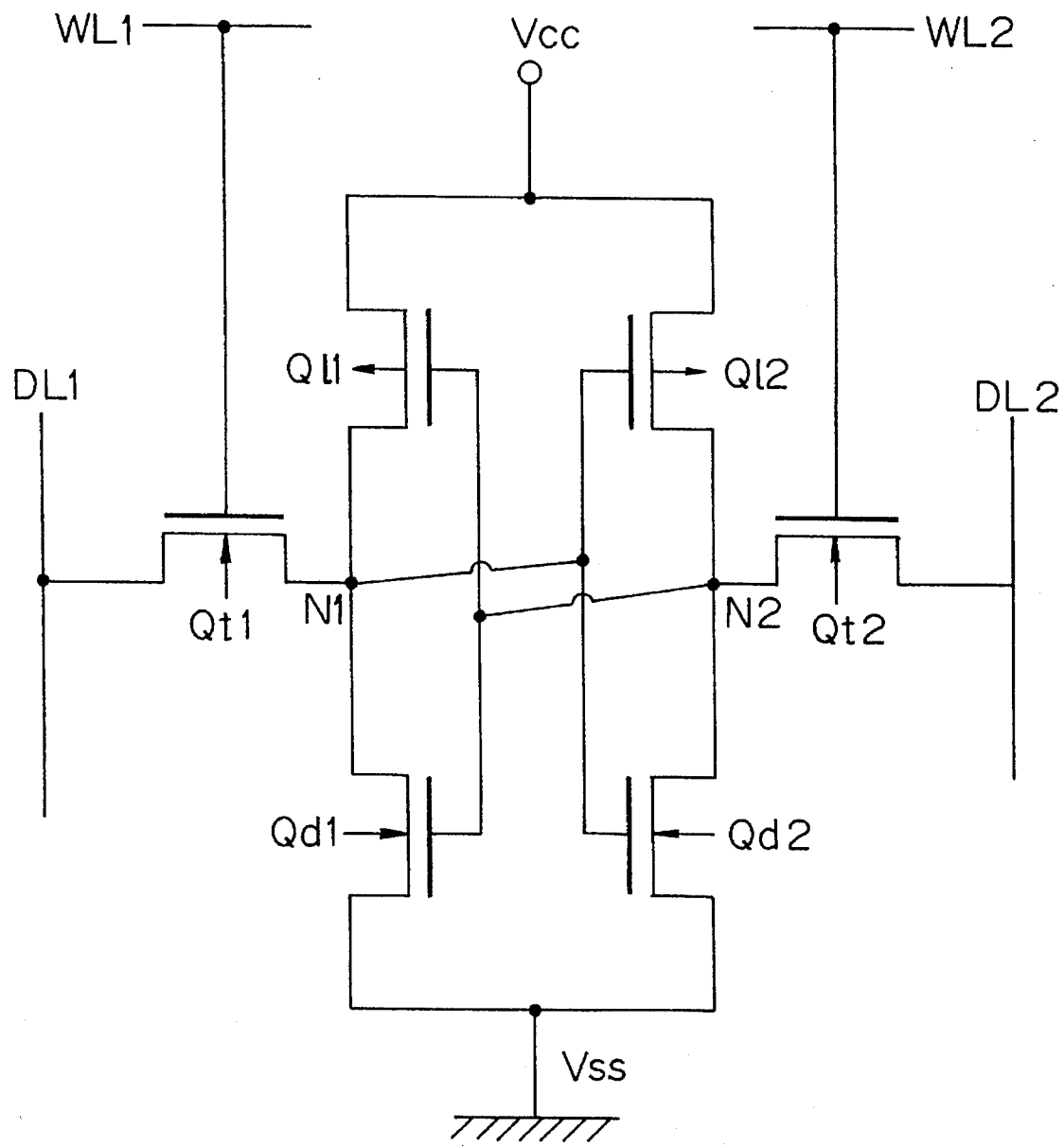
FIG. 1 is a circuit diagram of a CMOS SRAM cell as a subject matter of the present invention.
Figure 2:
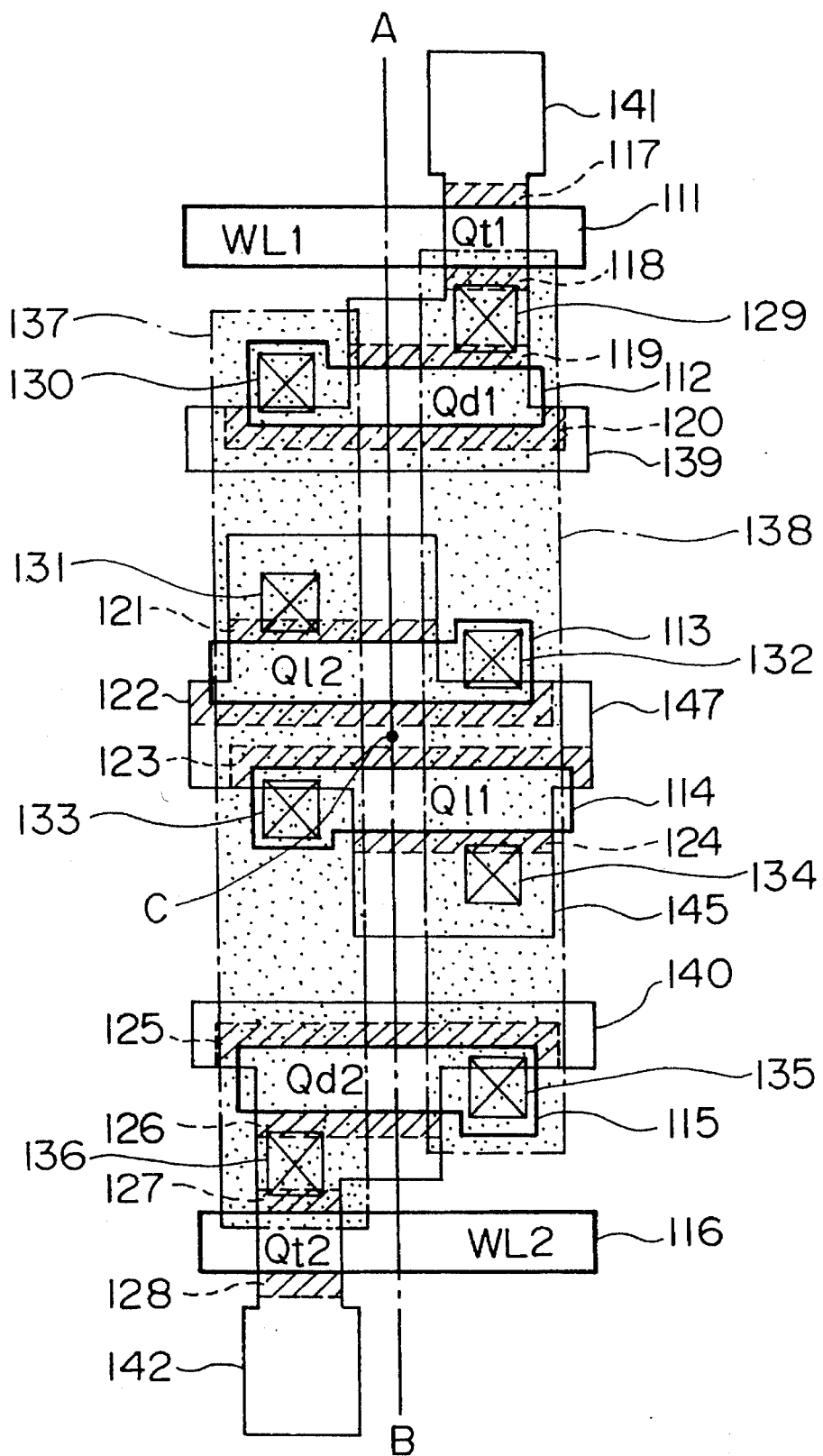
FIG. 2 is a plan view showing a conventional CMOS SRAM cell.
Figure 3:
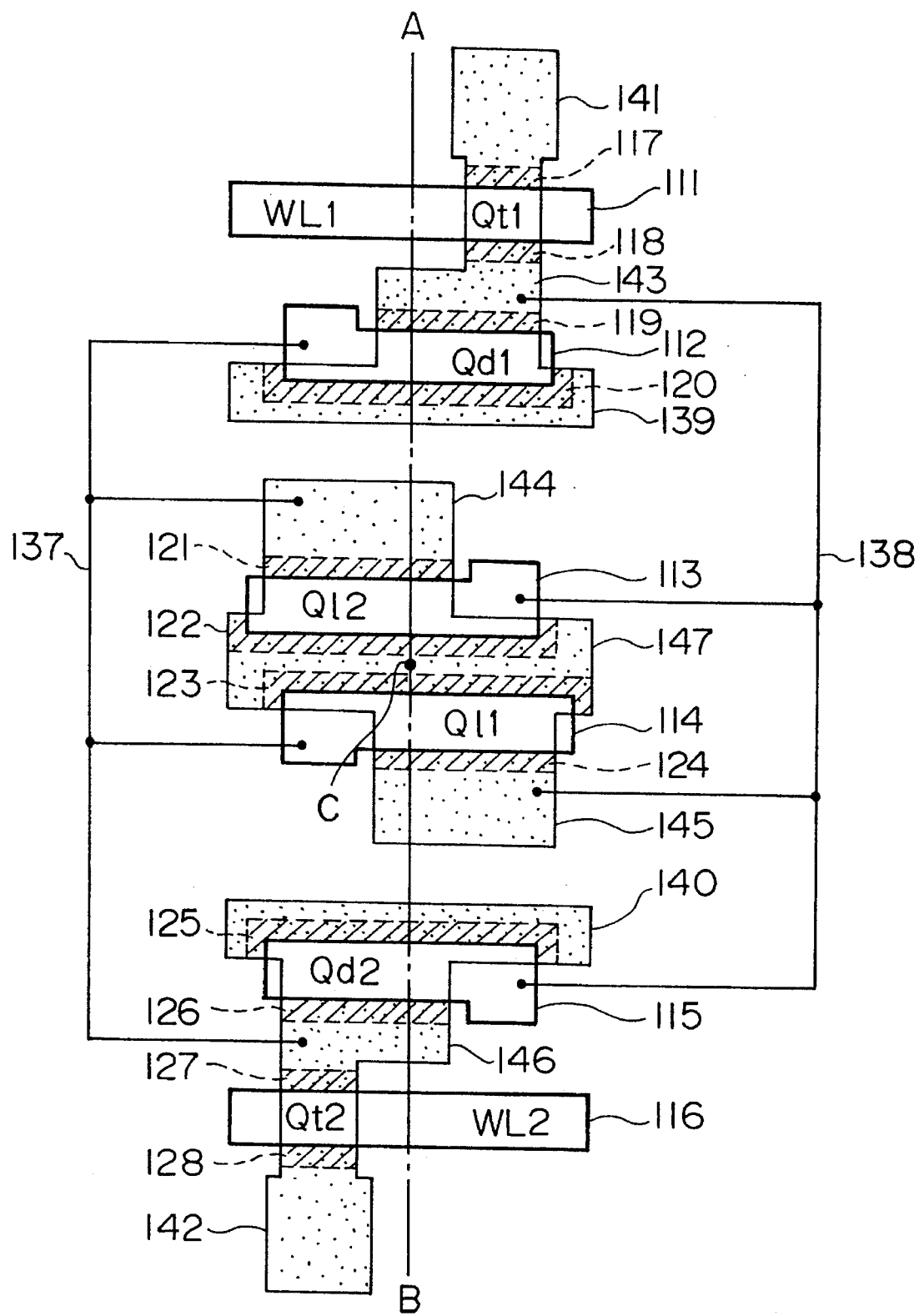
FIG. 3 is a plan view schematically showing the main part of the CMOS SRAM cell shown in FIG. 2.
Figure 4:
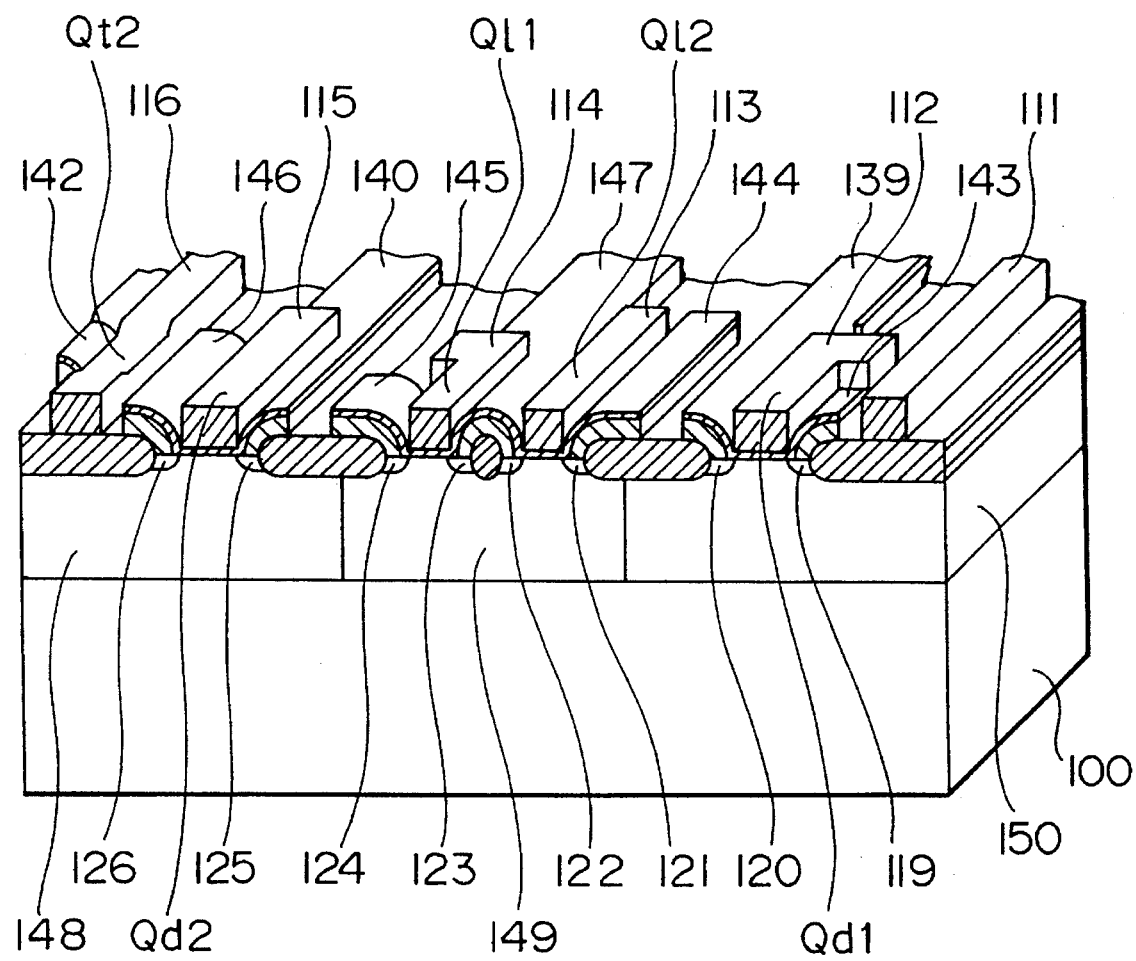
FIG. 4 is a perspective view showing a section of the CMOS SRAM cell shown in FIGS. 2 and 3 along a line A–B.
Figure 5:
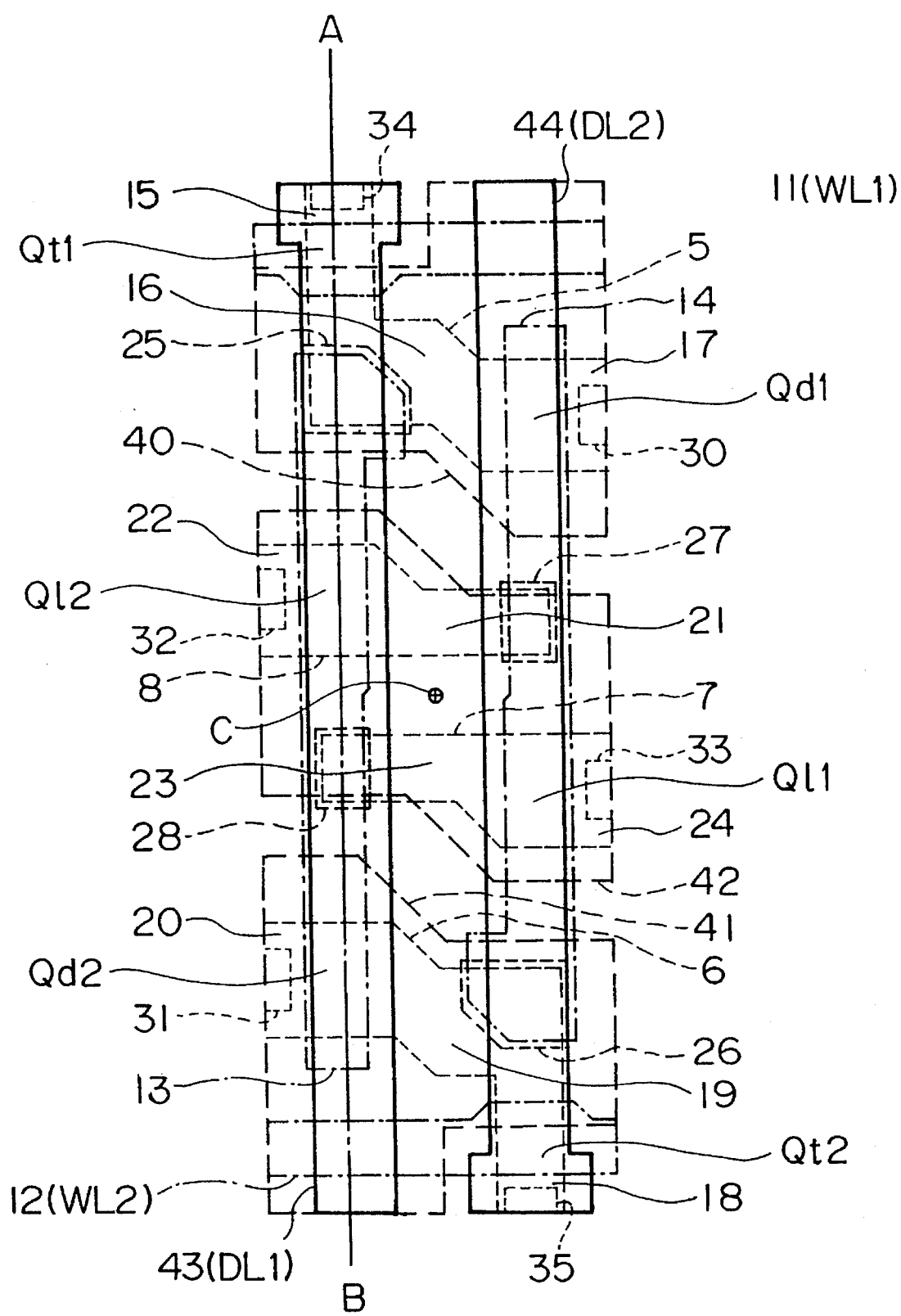
FIG. 5 is a plan view showing a CMOS static memory according to the first embodiment of the present invention.
Figure 8:
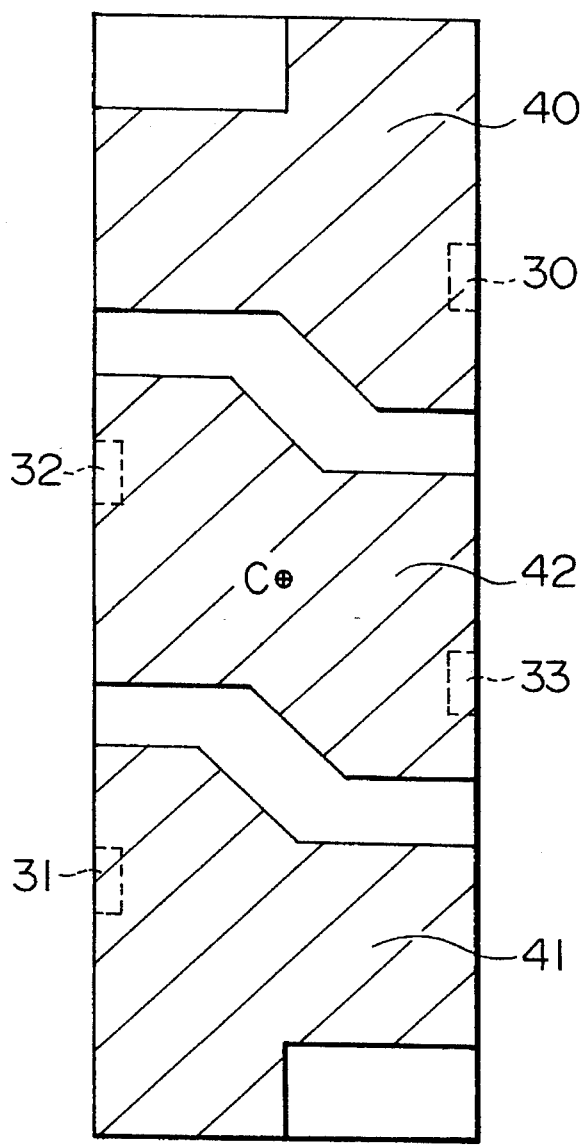
FIG. 8 is a plan view showing a memory cell layer of the CMOS static memory shown in FIG. 5.
Figure 9:
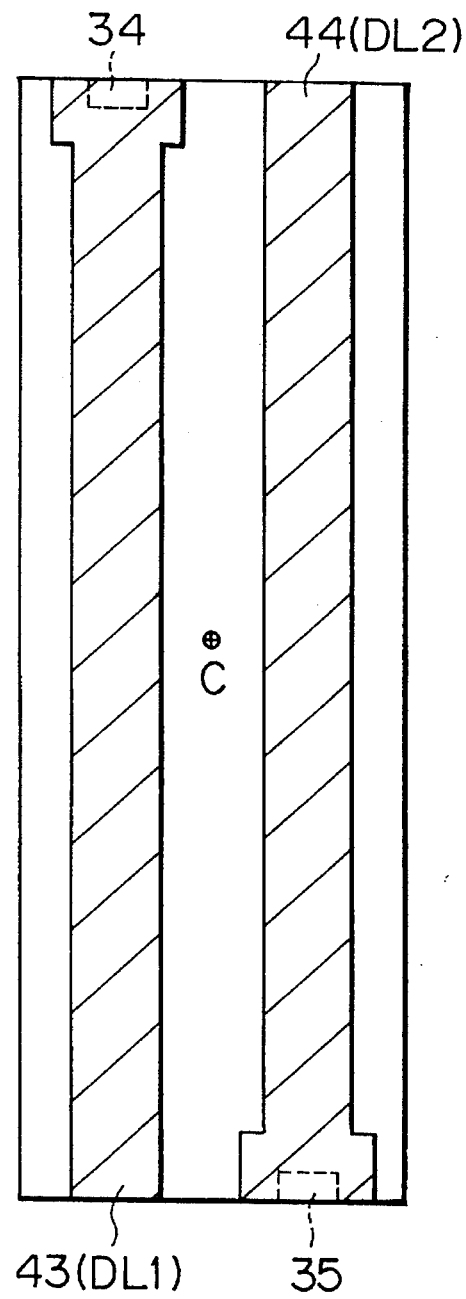
FIG. 9 is a plan view showing a memory cell layer of the CMOS static memory shown in FIG. 5.
Figure 10:
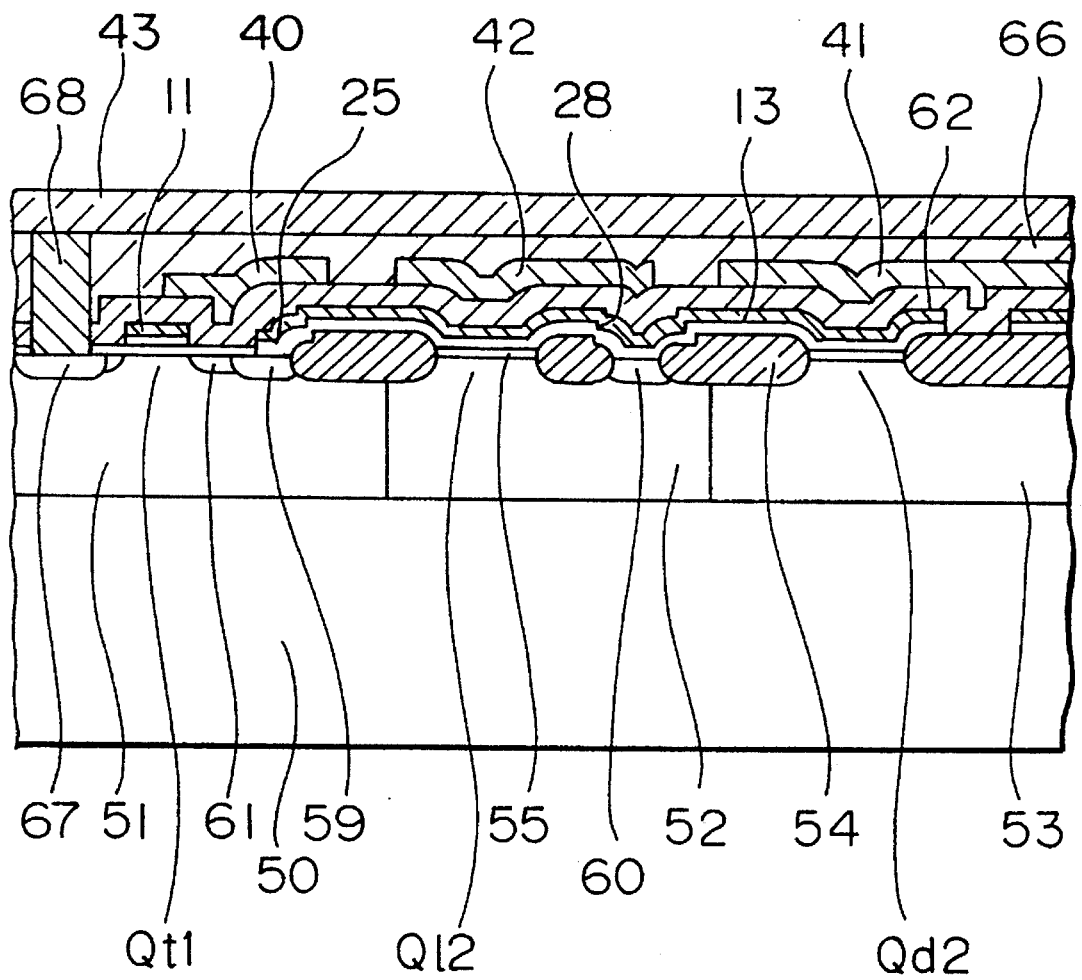
FIG. 10 is a sectional view of the first embodiment shown in FIG. 5 along a line A–B.

FIG. 5 is a plan view showing the layout of a cell of a CMOS static memory according to the first embodiment of the present invention. FIGS. 6 to 9 are plan views showing the layouts of the wiring layers of the cell in FIG. 5. FIG. 10 is a sectional view of the memory cell taken along a line A–B in FIG. 5. FIG. 1 is a circuit diagram of the memory cell. In the layouts shown in FIGS. 5 to 9, an adjacent cell has a structure which is mirror-reversed in both short and long sides. Therefore, as for a contact hole at the boundary to an adjacent cell, only half portion thereof is illustrated.

As shown in FIG. 5, two intracell wiring 13 and 14 almost parallel to each other are arranged between two word lines 11 (WL1) and 12 (WL2) almost parallel to each other so as to be perpendicular to the word lines 11 and 12. The intracell wiring 13 serves as gate electrodes of a driver transistor Qd2 and a load transistor Q12 and is connected to drain regions 16 and 23 of a driver transistor Qd1 and a load transistor Q11 through buried contacts 25 and 28, respectively. The intracell wiring 14 serves as gate electrodes of the driver transistor Qd1 and the load transistor Q11 and is connected to drain regions 19 and 21 of the driver transistor Qd2 and the load transistor Q12 through buried contacts 26 and 27, respectively.

A switching transistor Qt1 as an n-channel MOSFET is constituted by source and drain regions 15 and 16 and the gate electrode 11 serving as the first word line (WL1). A switching transistor Qt2 is constituted by source and drain regions 18 and 19 and the gate electrode 12 serving as the second word line (WL2). The driver transistor Qd1 as an n-channel MOSFET is constituted by source and drain regions 17 and 16 and the gate electrode 14. The driver transistor Qd2 is constituted by source and drain regions 20 and 19 and the gate electrode 13. The load transistor Q11 as a p-channel MOSFET is constituted by source and drain regions 24 and 23 and the gate electrode 14. The load transistor Q12 is constituted by source and drain regions 22 and 21 and the gate electrode 13. The source regions 17 and 20 of the driver transistors Qd1 and Qd2 are connected to ground wiring 40 and 41 through contact holes 30 and 31, respectively. The source regions 24 and 22 of the load transistors Q11 and Q12 are connected to a power supply wiring 42 through contact holes 33 and 32, respectively. Data lines 43 (DL1) and 44 (DL2) are connected to the switching transistors Qt1 and Qt2 through contact holes 34 and 35, respectively.

Referring to FIG. 5, reference numerals 5 and 6 denote n-channel element regions, and reference numerals 7 and 8 denote p-channel element regions.

As shown in FIGS. 6 to 9, these constituent elements form pairs in correspondence with two nodes in the cell and are arranged point symmetrical about a central point C of the cell. Therefore, even if the storage capacitances of the two nodes or capabilities of the transistors to-be-connected are different, the cell can be stably operated. The wiring has a three-layered structure in which the first layer is constituted by the intracell wiring layers and the word lines, the second layer is constituted by the ground wiring layers and the power supply wiring layer, and the third layer is constituted by the data lines. Since the intracell wiring layers are commonly used as gate electrodes, extra wiring layers for internal connection are unnecessary. The number of contact holes in the unit cell is decreased to seven as a whole, i.e., (½×2) contact holes for connection to the data line, the ground wiring layer, and the power supply wiring layer and four direct contacts. In addition, since no contact hole is formed on the gate electrodes, no margin is required between the contact holes and the gate electrodes, so that the size of the cell is not limited. The ground wiring layers and the power supply wiring layer are formed as the second wiring layer on the gate electrodes. For this reason, a sufficient wiring width is obtained regardless of the layout of the gate electrodes, the direct contacts, and the like to decrease the wiring resistance, thereby ensuring stability of the cell.

The section of the SRAM cell according to the present invention will be described below. As shown in the sectional view of FIG. 10, a P well 51, an N well 52, and a P well 53 are formed on the surface of a p-type substrate 50. These wells are formed by ion implantation of boron or phosphorus at an energy of 50 to 150 keV and a dose of $5 \times 10^{12}$ to $5 \times 10^{13}$ cm$^{-2}$ and diffusion at a temperature of about 1,200° C. or high-energy ion implantation of boron or phosphorus at an energy of 300 to 1,000 keV and a dose of $5 \times 10^{12}$ to $5 \times 10^{13}$ cm$^{-2}$. An element isolating field oxide film 54 having a thickness of 3,000 to 6,000 Å and the transistors are formed on the surfaces of the wells by selective oxidation. The transistors are constituted by a gate oxide film 55 as a thermal oxide film having a thickness of 100 to 200 Å, a gate electrode constituted by a word line 11 and an intracell wiring layer 13 as a tungsten polycide film, and a diffusion layer 61 formed by ion implantation of arsenic or boron at an energy of 20 to 70 keV and a dose of $1\times10^{15}$ to $1\times10^{16}$ cm$^{-2}$ and serving as source and drain regions, and the like. The intracell wiring layer 13 is connected to the diffusion layer serving as the drain regions of the transistors Qd1 and Q11 through a buried contact 25 formed in the gate oxide film 55 at a predetermined position. An impurity due to ion implantation for the source and drain regions is diffused in the well of the buried contact portion through the gate electrode, thereby forming diffusion layers 59 and 60. In this case, a p-n junction is formed in the polysilicon film as the lower layer of the polycide film of the intracell wiring layer 13, thereby forming n- and p-type regions. However, these regions are connected by the tungsten silicide film of the upper layer. Ground wiring layers 40 and 41 and a power supply wiring layer 42 as a tungsten silicide film having a thickness of 1,000 to 2,000 Å are formed on the gate wiring layer through an insulating film 62. A data line 43 as an aluminum wiring layer is formed on the resultant structure through an insulating film 66. The data line 43 is connected to the switching transistor Qt1 through a contact hole filled with a tungsten plug 68. The tungsten plug 68 is formed by deposition and etch-back of CVD tungsten having a thickness almost corresponding to the diameter of the contact hole on the entire surface after formation of the contact hole.

Figure 11:
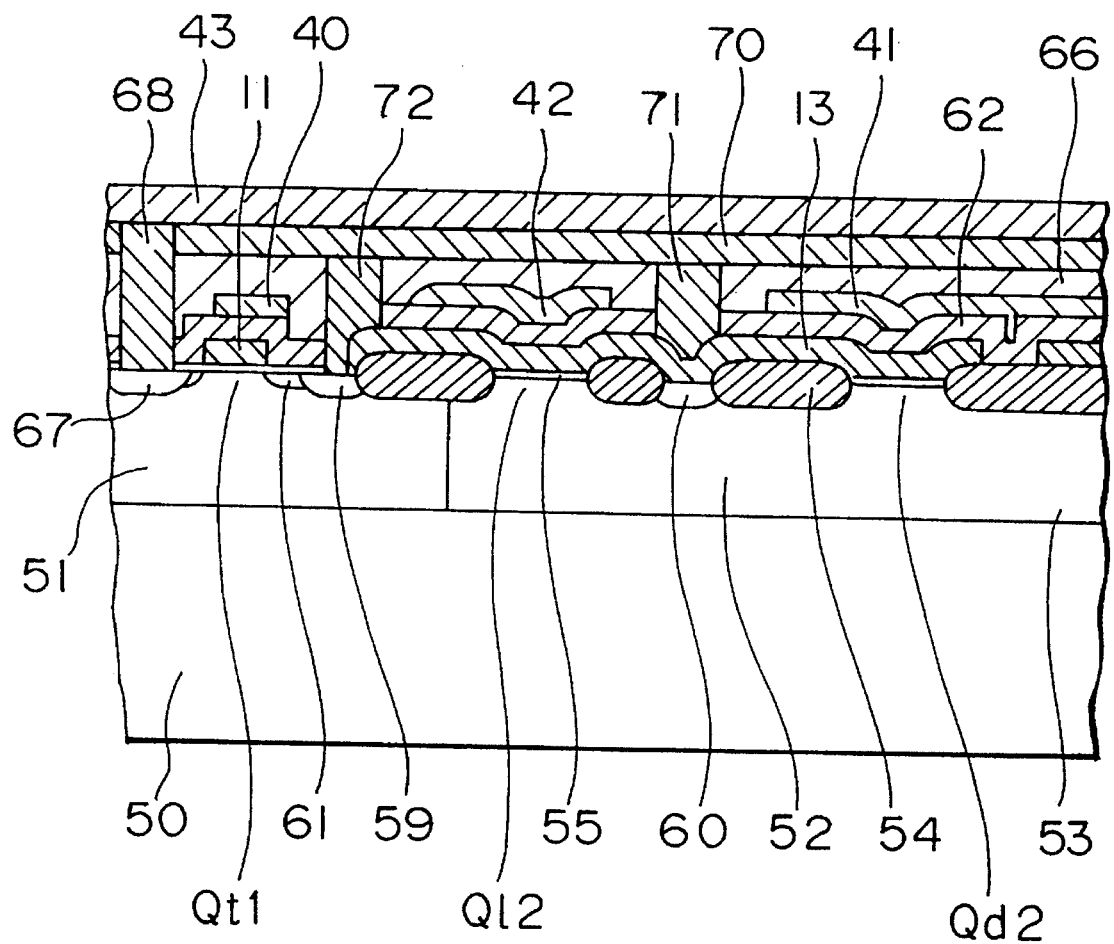
FIG. 11 is a sectional view showing a CMOS static memory according to the second embodiment of the present invention as in FIG. 10.

The second embodiment of the present invention will be described below with reference to FIG. 11 wherein like reference numerals indicate like components in FIG. 10. In this embodiment, no buried contact hole is used. After formation of an insulating film 66, contact holes filled with tungsten plugs 71 and 72 are formed at portions where the buried contact holes are formed in the first embodiment. Therefore, an intracell wiring layer 13 is connected to diffusion layers 59 and 60 serving as the drain regions of transistors Qd1 and Q11 through the tungsten plugs 71 and 72. In the above-described first embodiment, depending on annealing conditions, mutual diffusion of impurities of n- and p-channel portions occurs through the intracell wiring layer connected to the buried contact holes, thereby posing a problem of variations in transistor characteristics. In the second embodiment, however, the diffusion layers are connected to the intracell wiring layer through the tungsten plugs. For this reason, mutual diffusion of impurities is prevented, thereby obtaining stable transistor characteristics. Additionally, the tungsten plug can be stably formed with a low contact resistance as compared to a direct contact.

As has been described above, according to the present invention, in a CMOS static memory having constituent elements of a memory cell arranged point symmetrical, the constituent elements are arranged point symmetrical about the central point of the cell. For this reason, the cell can be stably operated without receiving influences of unbalance between storage capacitances of two nodes or capabilities of transistors to-be-connected. At the same time, since the intracell wiring layer is commonly used as a gate electrode, extra wiring layers for internal connection can be effectively eliminated. The ground wiring layers and the power supply wiring layer are formed as the second wiring layer at on the gate electrodes. Therefore, a sufficient wiring width is obtained regardless of the layout of the gate electrodes, the direct contacts, and the like to decrease the wiring resistance, thereby ensuring stability of the cell. In addition, the number of contact holes arranged symmetrically in the unit cell decreases to seven. Since no contact hole is formed on the gate electrode to make it unnecessary to ensure a margin between the contact hole and the gate electrode, the size of the cell can be effectively reduced.

What is claimed is:

1. A CMOS static memory including first and second driving transistors, first and second load transistors, and first and second switching transistors respectively arranged point symmetrical in a memory cell, comprising:

first and second word lines serving as gate electrodes of said first and second switching transistors and arranged substantially parallel to each other;

said first and second driver transistors and said first and second load transistors arranged between said substantially parallel word lines on a single substrate of said memory cell;

said two load transistors, said two driver transistors, and said two word lines arranged point symmetrical in a linear fashion on a single substrate surface;

first and second intracell wiring arranged substantially parallel to each other between said two word lines so as to be perpendicular to said word lines and wherein said first and second word lines and said first and second intracell wiring are arranged on the same layer; and ground wiring and a power supply wiring arranged on said word lines and said first and second intracell wiring through an insulating film.

2. A CMOS static memory including first and second driver transistors, first and second load transistors, and first and second switching transistors respectively arranged point symmetrical in a memory cell, comprising:

first and second word lines serving as gate electrodes of said first and second switching transistors and arranged substantially parallel to each other;

first and second intracell wiring arranged substantially parallel to each other between said two word lines so as to be perpendicular to said word lines; and ground wiring and a power supply wiring arranged on said word lines and said first and second intracell wiring through an insulating film, wherein said first intracell wiring serves as gate electrodes of said first driver transistor and said first load transistor and is connected to drain regions of said second driver transistor and said second load transistor, said second intracell wiring serves as gate electrodes of said second driver transistor and said second load transistor and is connected to drain regions of said first driver transistor and said first load transistor, said ground wiring are respectively connected to source regions of said first and second driver transistors, and said power supply wiring is connected to source regions of said first and second load transistors.

3. A CMOS static memory including first and second driving transistors, first and second load transistors, and first and second switching transistors respectively arranged point symmetrical in a memory cell, comprising:

first and second word lines serving as gate electrodes of said first and second switching transistors and arranged substantially parallel to each other;

said first and second driver transistors and said first and second load transistors arranged between said substantially parallel word lines on a single substrate of said memory cell;

said two load transistors, said two driver transistors, and said two word lines arranged point symmetrical in a linear fashion on a single substrate surface;

first and second intracell wiring arranged substantially parallel to each other between said two word lines so as to be perpendicular to said word lines and on the same layer as said two word lines;

ground wiring and a power supply wiring arranged on said word lines and said first and second intracell wiring through an insulating film; and first and second data lines arranged substantially parallel to each other on said ground wiring, and said power supply wiring through an insulating film.

\* \* \* \* \*